(12) United States Patent
Lin

(10) Patent No.: US 6,934,008 B2
(45) Date of Patent: Aug. 23, 2005

(54) MULTIPLE MASK STEP AND SCAN ALIGNER

(75) Inventor: Burn J. Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/918,863

(22) Filed: Aug. 16, 2004

(65) Prior Publication Data
US 2005/0012914 A1 Jan. 20, 2005

Related U.S. Application Data

(62) Division of application No. 10/056,650, filed on Jan. 28, 2002, now Pat. No. 6,777,143.

(51) Int. Cl.[7] .................................................. G03B 27/42
(52) U.S. Cl. .......................................................... 355/53
(58) Field of Search .............................. 355/53, 67, 72, 355/75; 430/22, 30

(56) References Cited

U.S. PATENT DOCUMENTS

| | | | |
|---|---|---|---|
| 4,924,258 A * | 5/1990 | Tsutsui ........................ 355/53 |
| 5,847,813 A | 12/1998 | Hirayanagi ................... 355/75 |
| 5,989,761 A | 11/1999 | Kawakubo et al. ........... 430/22 |
| 2004/0032575 A1 * | 2/2004 | Nishi et al. .................... 355/53 |
| 2004/0043311 A1 * | 3/2004 | McCullough et al. ......... 430/30 |
| 2004/0156028 A1 * | 8/2004 | Okada .......................... 355/53 |

OTHER PUBLICATIONS

U.S. Appl. No. 10/056,650, filed Jan. 28, 2002; Lin.

* cited by examiner

*Primary Examiner*—D. Rutledge
(74) *Attorney, Agent, or Firm*—Thomas, Kayden, Horstemeyer & Risley (57) ABSTRACT

A new optical lithographic exposure apparatus is described. The apparatus may comprise, for example, a lithographic stepper or scanner. A wafer stage comprises a means of supporting a semiconductor wafer. A mask stage comprises a means of holding a first mask and a second mask and maintaining a fixed relative position between the first mask and the second mask. The mask stage may further comprise an independent means of aligning each mask. A light source comprises a means to selectively shine actinic light through one of the first mask and the second mask. An imaging lens is capable of focusing the actinic light onto the semiconductor wafer.

17 Claims, 13 Drawing Sheets

← SCANNING DIRECTION →

MULTIPLE MASK STEP AND SCAN ALIGNER

CROSS-REFERENCE TO RELATED APPLICATIONS

This application is a division of U.S. patent application Ser. No. 10/056,650, filed on Jan. 28, 2002, now U.S. Pat. No. 6,777,143.

BACKGROUND OF THE INVENTION (1) Field of the Invention

The invention relates to a method of fabricating semiconductor structures, and more particularly, to an optical lithographic exposure apparatus with a multiple mask capability suitable for double-exposure processes in the manufacture of integrated circuits.

(2) Description of the Prior Art

As optical lithography is used to delineate 0.1 micron and smaller features, the lithographic tools must work in a low $k_1$ region. The $k_1$, or Rayleigh's coefficient, for resolution, is given by the equation:

$$k_1 = \frac{CD \times NA}{\lambda}$$

where CD is the critical dimension of the line feature, NA is the numerical aperture, and $\lambda$ is the wavelength of the exposure light. For example, if the exposure wavelength is 193 nanometers and the NA is 0.63, then $k_1$ is 0.39. At such a low $k_1$, extremely aggressive image enhancing techniques have to be used to produce usable images for IC manufacture. One such technique is the use of double exposures with two different masks.

For example, an alternating phase shifting mask (PSM) may be used when the desired feature size of an integrated circuit layer is on the same order of magnitude as the wavelength of light used in the photolithographic process. If a PSM is used, then a second exposure from a binary intensity mask (BIM) must be performed to remove any extra lines caused by the phase shifting interference at the feature boundaries.

In a typical photolithographic mask, layer features, or traces, are formed on the mask in an opaque material such as chrome. This chrome layer is formed overlying a transparent quartz substrate. Light is shown through this mask to expose a photosensitive material, commonly photoresist, as defined by the mask pattern. After the photoresist is developed, the photoresist will reflect a copy or a reverse copy of the mask pattern.

However, in a phase shifting mask, an additional component is added to the chrome and quartz system. Either through the application of an additional transparent layer or the through the removal of a portion of the quartz layer to a specific depth, the optical properties are changed in a part of the transparent (not covered by chrome) sections of the mask. Specifically, when light of the lithographic wavelength is shown through the mask, a phase shift is created between light waves that pass through the phase shifted area and the light waves that pass through the non-phase shifted area. By shifting the phase of the light by 180 degrees, nodes, or cancellations of energy will occur at opaque boundaries between the phase shifted and non-phase shifted areas. This principle is used to create more sharply defined boundary conditions during the photolithographic exposure. Sharper definition leads to improved pattern transfer.

Figure 1:
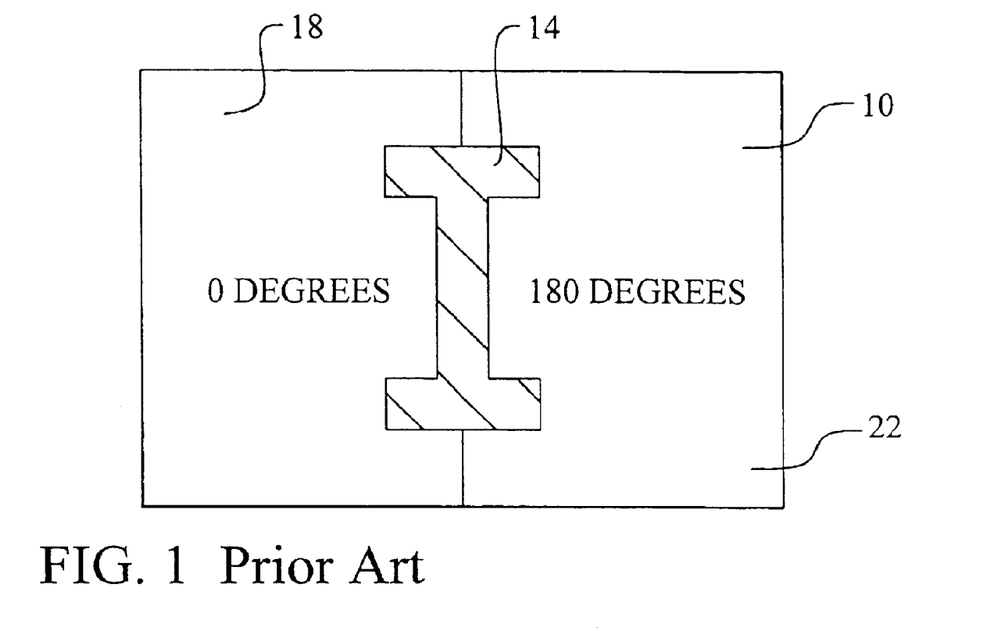
FIG. 1 illustrates in simplified form an alternating phase shifting mask (PSM).

In the case of the PSM method, two distinct reticles, the phase shifting mask (BIM) and binary intensity mask (BIM) are used. Referring now to FIG. 1, an alternating PSM mask 10 is shown for a simple feature. A chrome line 14 is formed on the mask. The chrome 14 is opaque and reflects exposure light away from the semiconductor wafer. The transparent regions of the mask 10 are divided into a zero degree, or non-phase shifting, region 18 and a 180 degree, or phase shifting, region 22. The phase shifting region 22 is specially treated to cause the transmitted exposure light to be shifted 180 degrees with respect to transmitted exposure light traveling through the non-phase shifting region 18.

Figure 2:
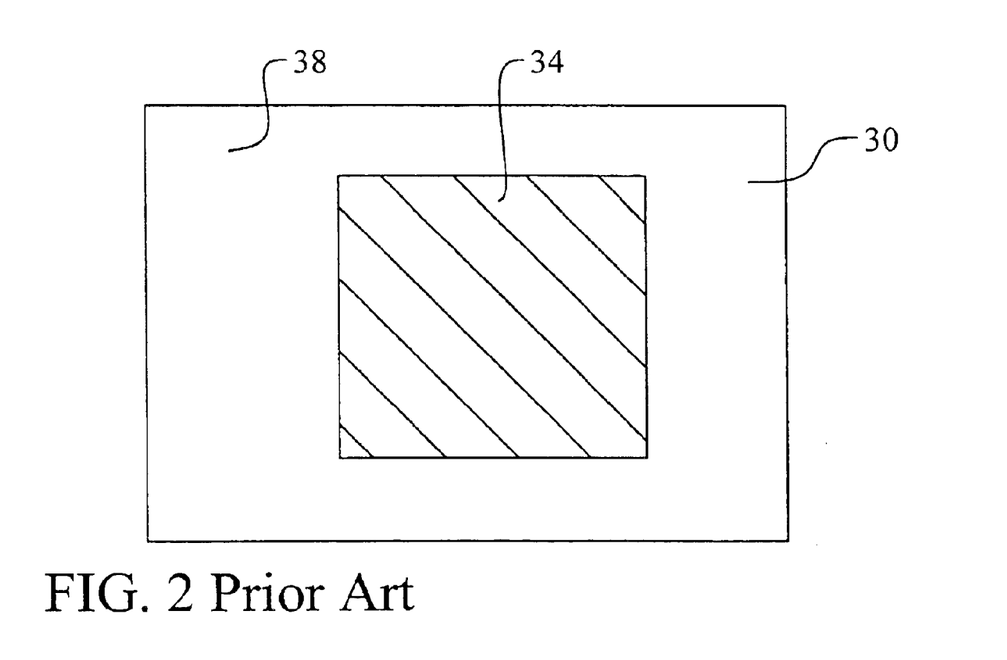
FIG. 2 illustrates in simplified form a binary intensity mask (BIM).

Referring now to FIG. 2, the BIM mask 30 is illustrated. The purpose of the BIM mask 30 is to remove any extra lines caused by the interference of the phase shifted light and non-phase shifted light at the boundaries of each region. The BIM mask 30 contains a chrome feature 34 overlying the transparent substrate 38. The feature 34 is an appropriately oversized copy of the critical PSM feature of the PSM mask.

The PSM mask and the BIM mask are used sequentially. First, the semiconductor wafer is coated with a photoresist layer. Second, the PSM mask of FIG. 1 is loaded into the mask stage of the optical lithographic stepper and aligned. The photoresist layer is then exposed, field by field, to actinic light through the PSM mask. Third, the PSM mask is replaced with the BIM mask of FIG. 2. The BIM mask must be aligned. The undeveloped photoresist layer is exposed, field-by-field, to actinic light through the BIM layer. At the end of the process, every field has been exposed to thereby superimpose the patterns of the PSM mask and the BIM mask in every field.

Figure 3:
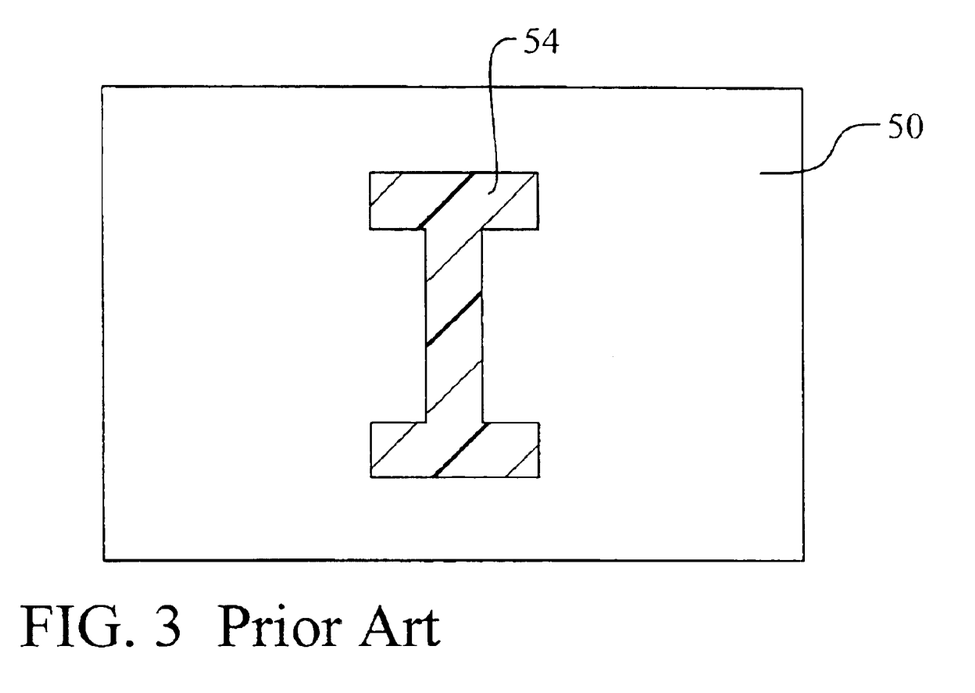
FIG. 3 illustrates in simplified form a photoresist feature formed by double-exposure using the PSM mask of FIG. 1 and the BIM mask of FIG. 2.

Referring now to FIG. 3, a top view of the semiconductor substrate is shown. The photoresist layer 54 is developed. The photoresist layer 54 exhibits a very defined pattern overlying the semiconductor substrate 50. The double-exposure method enables the creation of smaller line widths than possible with a single, non-phase shifted exposure.

If a conventional stepper is used for this process, the operator must first install and then align the first mask. After exposing through the first mask, the operator must remove the first mask and install the second mask. This is because the conventional stepper can only hold and align a single mask at a time. The second mask must be aligned prior to the second exposure. It would be very advantageous and cost saving to eliminate a reticle change and alignment from the double-exposure process.

Several prior art approaches concern methods to double-expose an integrated circuit and apparatus for holding masks. U.S. Pat. No. 5,989,761 to Kawakubo et al teaches a method to expose photolithographic masks onto a substrate. First and second masks, corresponding to different substrate layers, are used. The first and second masks are exposed with different apparatus having different exposure field sizes. The first mask is exposed on the first apparatus. A perpendicular error and a mean value of rotation are detected for the first exposure. The second mask is rotated based on the detected error of the first mask to compensate and correct the error. U.S. Pat. No. 5,847,813 to Hirayanagi discloses a mask holding apparatus for lithographic exposure masks. The apparatus adds an inner frame to the conventional outer frame to thereby improve support, thermal transfer, and electrical grounding. U.S. Pat. No. 4,924,258 to Tsutsui teaches a mask holding and conveying mechanism. The mask holding mechanism comprises a reference member, an aperture, a spring-biased first member, and a spring-biased second member.

SUMMARY OF THE INVENTION

A principal object of the present invention is to provide an effective optical lithographic exposure apparatus and method of use thereof for patterning a photoresist layer in the manufacture of an integrated circuit device.

A further object of the present invention is to provide an exposure apparatus capable of holding two masks in a fixed relative position for sequential exposure of the mask patterns onto a semiconductor wafer.

A yet further object of the present invention is to provide an exposure apparatus capable of aligning two masks prior to the sequential exposure of the mask patterns onto a semiconductor wafer to thereby save time.

Another yet further object of the present invention is to provide an exposure apparatus capable of independently aligning two masks.

Another further object of the present invention is to provide an effective and very manufacturable method to pattern a photoresist layer wherein the photoresist layer is sequentially exposed to actinic light through two different masks.

Another yet further object of the present invention is to use a two mask holding apparatus to sequentially expose the photoresist layer through a PSM mask and through a BIM mask to thereby enhance the image of the pattern.

Another yet further object of the present invention is to expose sequentially the photoresist layer through the first mask and the second mask without a mask change and alignment to thereby save time.

In accordance with the objects of this invention, a new optical lithographic exposure apparatus is described. The apparatus may comprise step and scan capability. A wafer stage comprises a means of supporting a semiconductor wafer. A mask stage comprises a means of holding a first mask and a second mask and maintaining a fixed relative position between the first mask and the second mask. The mask stage may further comprise an independent means of aligning each mask. A light source comprises a means to selectively shine actinic light through either the first mask or the second mask. An imaging lens is capable of focusing the actinic light onto the semiconductor wafer. A means of stepping the mask stage across the semiconductor wafer is provided.

Also in accordance with the objects of the present invention, a new method to pattern a photoresist layer in the manufacture of an integrated circuit device is achieved. A photoresist layer is deposited overlying a semiconductor substrate. A first mask and a second mask are loaded into a mask stage of an optical lithographic exposure apparatus having a step and scan capability. The mask stage maintains a fixed relative position between the first mask and the second mask. The first mask and the second mask are aligned. The wafer is indexed to a starting field that becomes the current field. The first mask is scanned to expose the current field. The wafer is then indexed to a next field unexposed by the first mask. The stepping and scanning is repeated until every field on the semiconductor substrate is exposed with the first mask. The wafer is then indexed to the starting field that becomes the current field. The second mask is scanned to expose the current field. The wafer is then indexed to a next field unexposed by the second mask. The stepping and scanning is repeated until every field on the semiconductor substrate is exposed with the second mask. The patterns of the first mask and the second mask are thereby superimposed in every field. The photoresist layer is developed to thereby complete the patterning in the manufacture of the integrated circuit device.

Also in accordance with the objects of the present invention, a new method to pattern a photoresist layer in the manufacture of an integrated circuit device is achieved. A photoresist layer is deposited overlying a semiconductor substrate. A first mask and a second mask are loaded into a mask stage of an optical lithographic exposure apparatus having a step and scan capability. The mask stage maintains a fixed relative position between the first mask and the second mask. The first mask and the second mask are aligned. The wafer is indexed to a starting field that becomes the current field. The first mask is scanned to expose the current field. The second mask is scanned to expose the adjacent field. The wafer is stepped to a next field unexposed by the first mask. The stepping and scanning is repeated until every field on the semiconductor substrate is exposed. The wafer is indexed to the starting field. The wafer is then stepped to a next field unexposed by the second mask to become the current field. The second mask is scanned to expose the current field. The wafer is then indexed to the next field unexposed by the first mask to become the current field. The first mask is scanned to expose the current field. The stepping and scanning is repeated until every field on the semiconductor substrate is exposed. The patterns of the first mask and the second mask are thereby superimposed in every field. The photoresist layer is developed to thereby complete the patterning in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiments disclose an optical lithographic exposure apparatus with a novel mask stage capable of holding and aligning two masks at a time. This apparatus may comprise, for example, an optical stepper or scanner. Further, it is preferred that the exposure apparatus have a step and scan capability. This apparatus is ideally suited for double-exposure processing in the manufacture of an integrated circuit device. In addition, two methods for double exposing using a two-mask step and scan process are described. It should be clear to those experienced in the art that the present invention can be applied and extended without deviating from the scope of the present invention.

Figure 4:
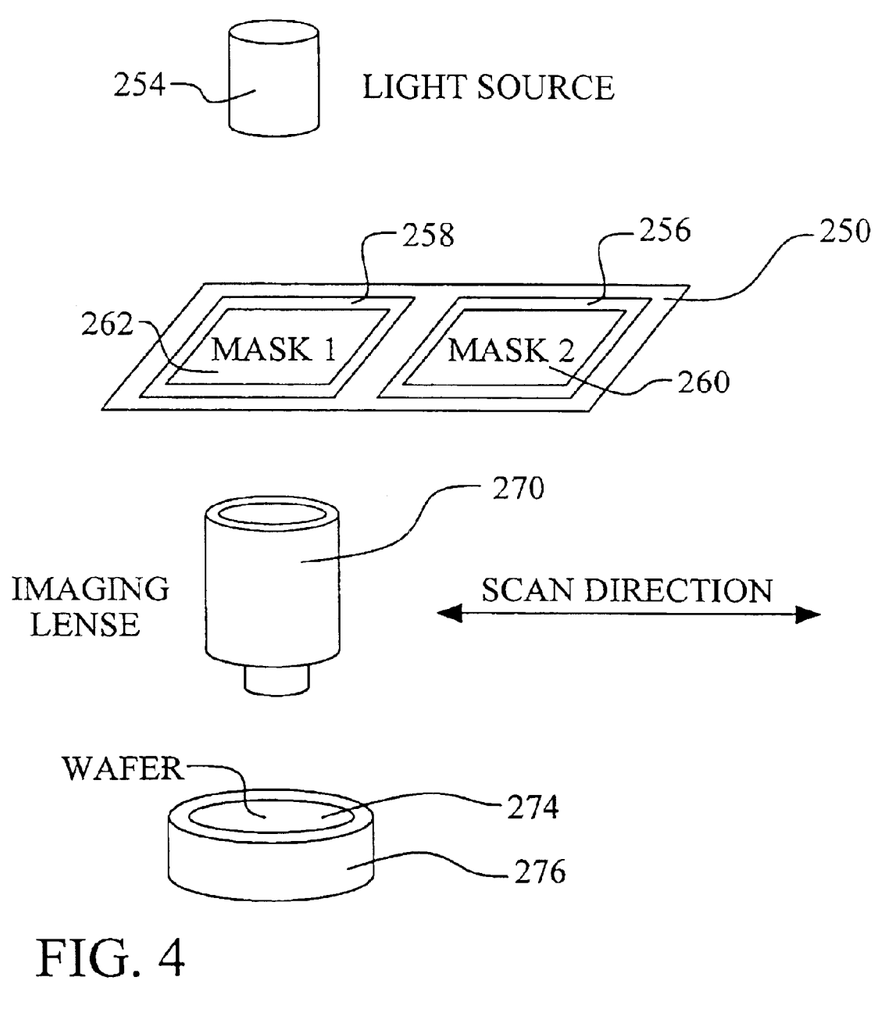
FIG. 4 illustrates in simplified form the key components of the preferred embodiment of the optical stepper apparatus of the present invention.

Referring now particularly to FIG. 4, a simplified form of the preferred embodiment of the apparatus of the present invention illustrated. The key components of a new optical lithographic exposure apparatus are shown. This apparatus adds the ability to load and align two masks and then expose a semiconductor wafer using each of these reticles without a time consuming mask change and alignment step. The semiconductor wafer 274 is supported on a wafer stage 276.

An important aspect of the present invention is the novel mask stage 250. This mask stage 250 comprises a means of holding a first mask 262 and a second mask 260. Each mask 260 and 262 is held in a separate fixture 256 and 258 in the mask stage 250. Each mask 260 and 262 can be independently aligned to the wafer 274 and to the other mask. Once aligned, the mask stage 250 maintains the fixed relative position between the first mask 262 and the second mask 260.

The ability to independently hold and align the two masks 260 and 262 allows an operator to load both masks at the beginning of the lithographic operation. Both masks 260 and 262 are then aligned. Each mask can then be used for exposing fields on the semiconductor wafer 274 without a time consuming mask change therebetween.

A light source 254 comprises a means of selectively shining actinic light through either the first mask 262 or the second mask 260. The light source 254 may comprise, for example, a laser-based source with a specific light wavelength. In the preferred embodiment, the light source 254 comprises a wavelength of 193 nanometers. The light source 254 may include an optical circuit capable of flashing the actinic light for a specific length of time.

An imaging lens 270 is capable of focusing the actinic light that passes through either of the masks 260 and 262 onto the semiconductor wafer 274. The imaging lens 270 and the mask stage 250 are linked such that the image of the exposed mask will be focused onto a particular field of the wafer 274 during each exposure step. Further, the imaging lens 270 and the mask stage 250 can be stepped, or indexed, from field to field across the semiconductor wafer.

The preferred application of the stepper apparatus having a two-mask stage 250 is the double-exposure process described in FIGS. 1 through 3. For example, an alternating PSM mask of the type shown in FIG. 1 may be loaded into the first mask fixture 258. A binary intensity mask (BIM) of the type shown in FIG. 2 may be loaded into the second mask fixture 256. Both masks 260 and 262 are then aligned. The apparatus may then be used to sequentially expose every field on the semiconductor wafer to actinic light through both the PSM mask 262 and the BIM mask 260 such that the patterns of each mask are superimposed on each field. The novel ability to hold two masks, to maintain a fixed relational position between the two masks, and to align both masks prior to exposure provides a significant flexibility and time savings for the operator.

Figure 9:
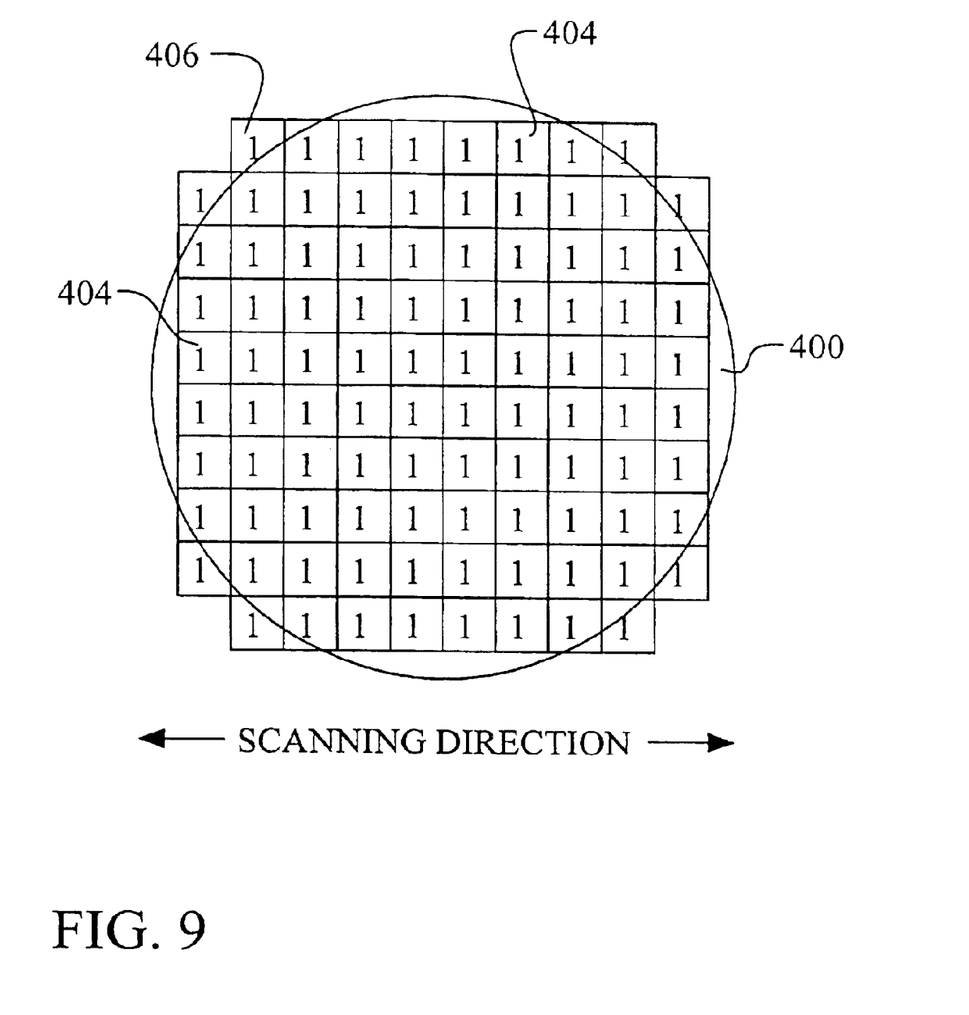
FIGS. 9 and 10 illustrate a semiconductor wafer processed by the first preferred embodiment of the method of the present invention.

Referring briefly now to FIG. 9, a semiconductor wafer 400 is illustrated. An array of fields 404 is shown. The exposure apparatus of the present invention exposes single fields 404 across the wafer. When fields are completed, the stepper indexes to the next field until the entire wafer is exposed. Each field may comprise several integrated circuit die. The preferred embodiment exposure apparatus comprises a step and scan capability. Step and scan uses an illuminated slot which is scanned over the mask to expose the wafer. While the lens remains stationary, the mask and wafer move in a controlled fashion. The wafer is stepped to a field and then the mask is scanned. In a 4X system, for example, the mask moves 4 times faster than the wafer.

Returning now to FIG. 4, note that the scanning direction of the apparatus is shown. In this embodiment, the novel mask stage 250 is configured such that the first mask 262 and the second mask 260 are placed side-by-side in the same direction as the scanning direction. Alternatively, the first mask and second mask may be configured across the scanning direction.

Figure 5:
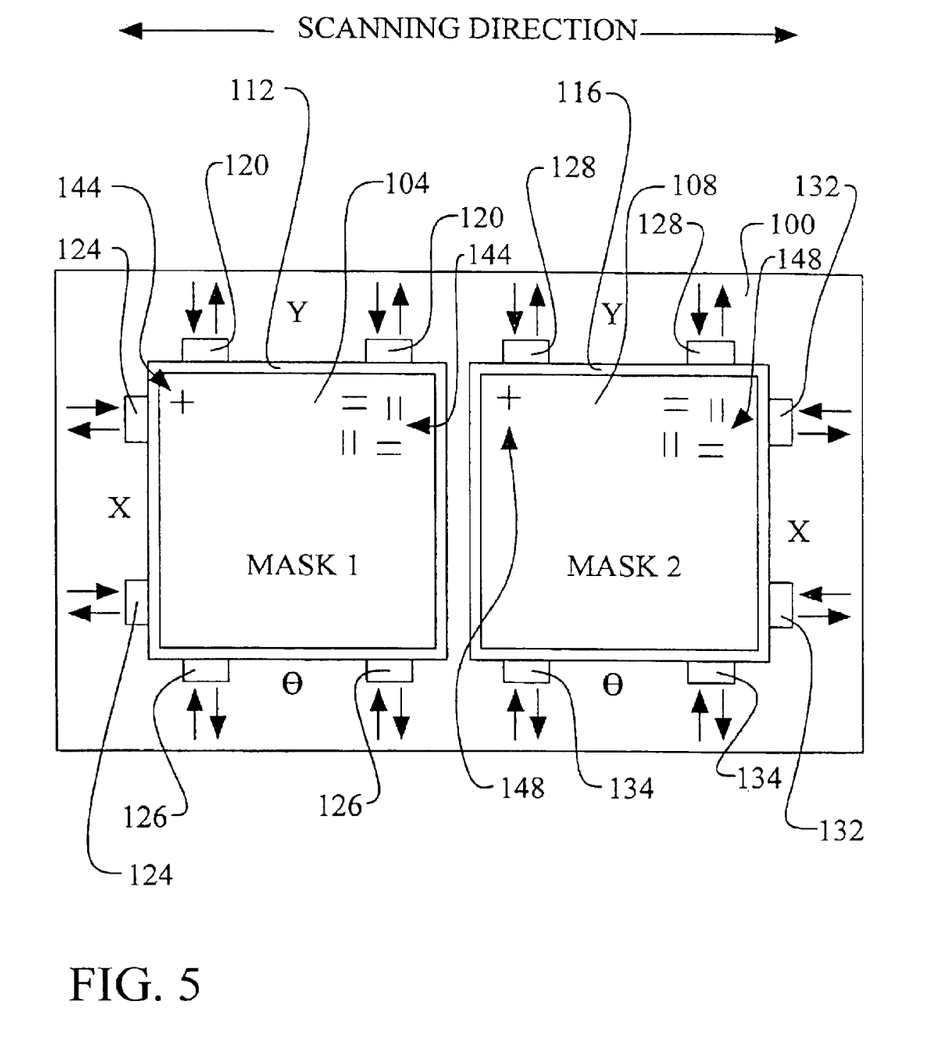
FIGS. 5 and 6 illustrate two configurations of a mask stage for the preferred embodiment apparatus of the present invention.

Referring now to FIG. 5, one such configuration of the mask stage is shown in greater detail. Several important features of the present invention are shown. In this configuration, the mask stage 100 is configured such that the fixed relative position between the first mask 104 and the second mask 108 is consistent with the scanning direction. Further, the first mask 104 and the second mask 108 are adjacent to each other and in the same plane (coplanar).

Each wafer fixture 112 and 116 in the mask stage 100 has a set of independent alignment controls. The first fixture 112 may have an 'x' lateral control 124 and a 'y' lateral control 120, or both. Similarly, the second fixture 116 may have an 'x' lateral control 132 and a 'y' lateral control 128, or both. In addition, the first fixture 112 and the second fixture 116 may have angular controls 126 and 134 to adjust the angle of placement (θ) of each mask. The alignment controls are used to carefully align the mask alignment marks 144 and 148 on the masks 104 and 108 with the wafer alignment marks. These alignment controls may comprise mechanical actuators or electromechanical actuators. Once aligned, the mask stage 100 maintains alignment.

Figure 6:
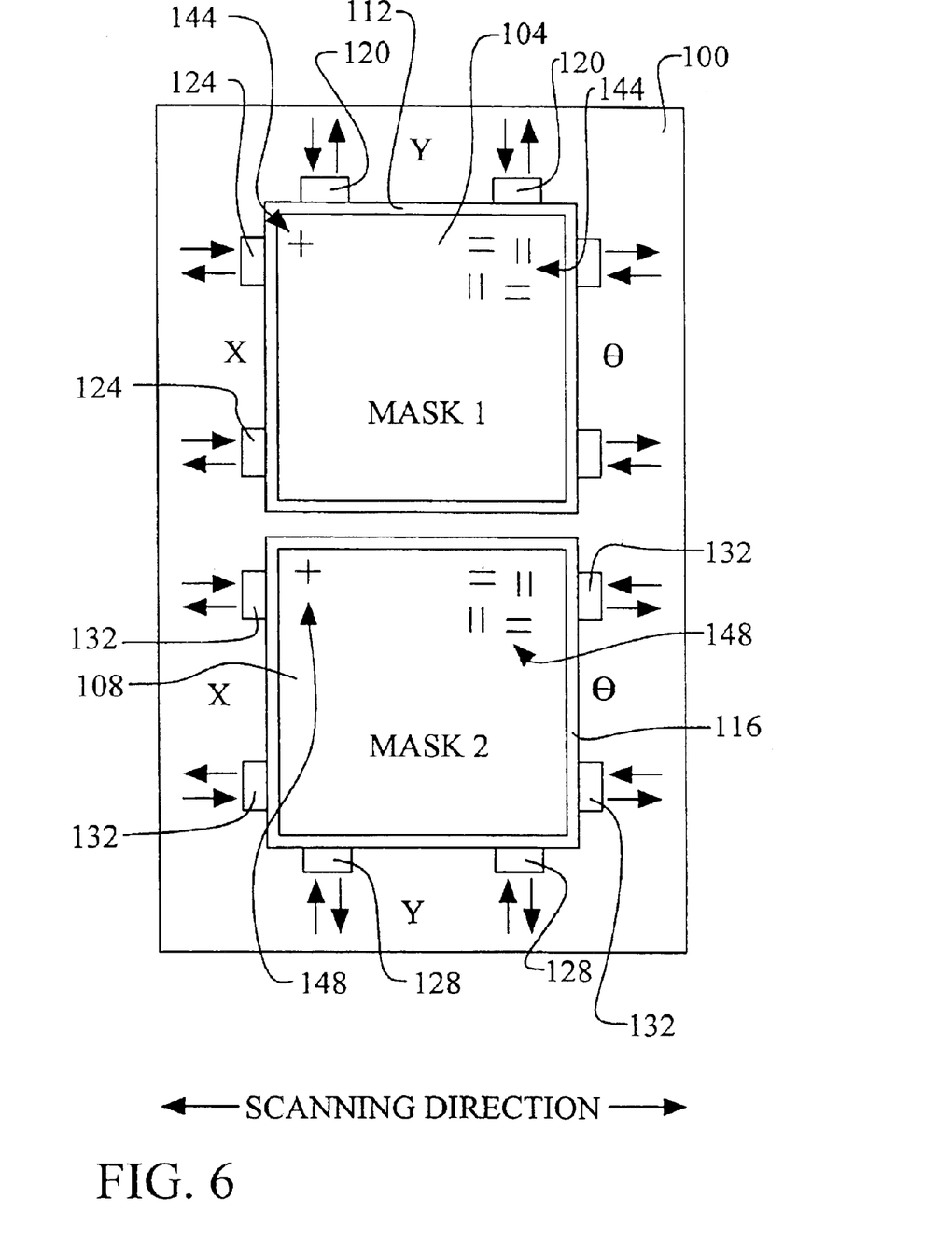

Referring now to FIG. 6, the mask stage 100 is shown in a second scanning configuration. In this configuration, the mask stage 100 is configured such that the fixed relative position between the first mask 104 and the second mask 108 is perpendicular with the scanning direction. Again, the first mask 104 and the second mask 108 are adjacent to each other and in the same plane (coplanar).

Figure 7:
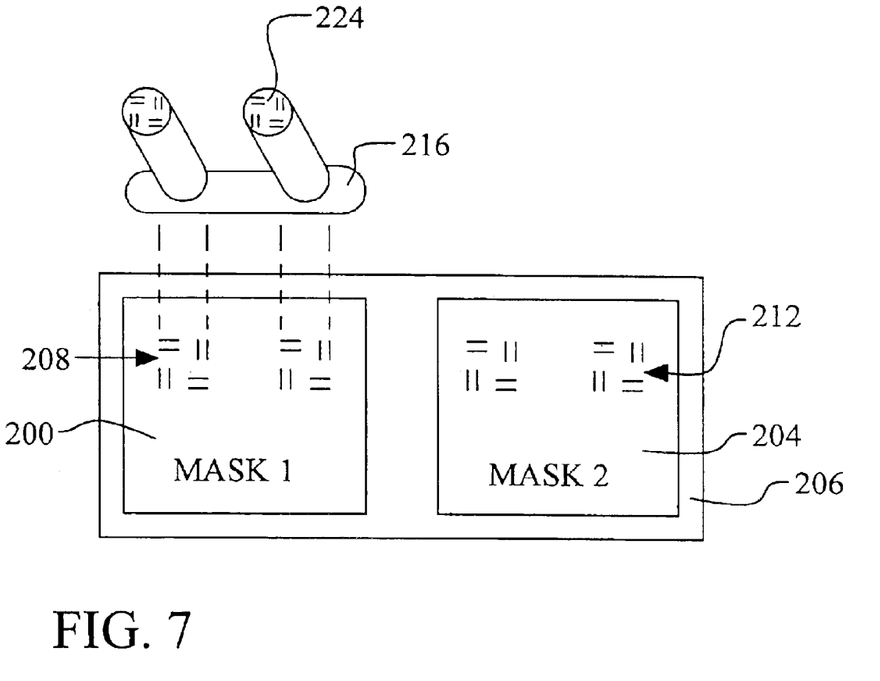
FIG. 7 illustrates the optional addition of a viewing microscope with alignment marks to the apparatus of the present invention.

Referring now to FIG. 7, an optional feature of the present invention is illustrated. A microscope viewer 216 provides a complimentary alignment and viewing means for the operator. The operator uses the microscope view 216 to register the alignment marks 208 and 212 on the masks 200 and 204 with complimentary alignment marks 224 on the microscope objectives of the microscope viewer 216. Thus, the alignment marks 224 on the microscope objectives of the microscope viewer 216 and the alignment marks 208 and 212 on the masks 200 and 204 can be aligned. This enables an off-axis alignment mechanism for the operator.

The two-mask stage of the present invention may be extended to a multiple mask stage by adding an additional mask fixture and alignment system. In this case, the first mask, second mask, and additional mask would be held in a fixed relative position after alignment to facilitate a sequential exposure of a wafer using each mask.

Figure 8:
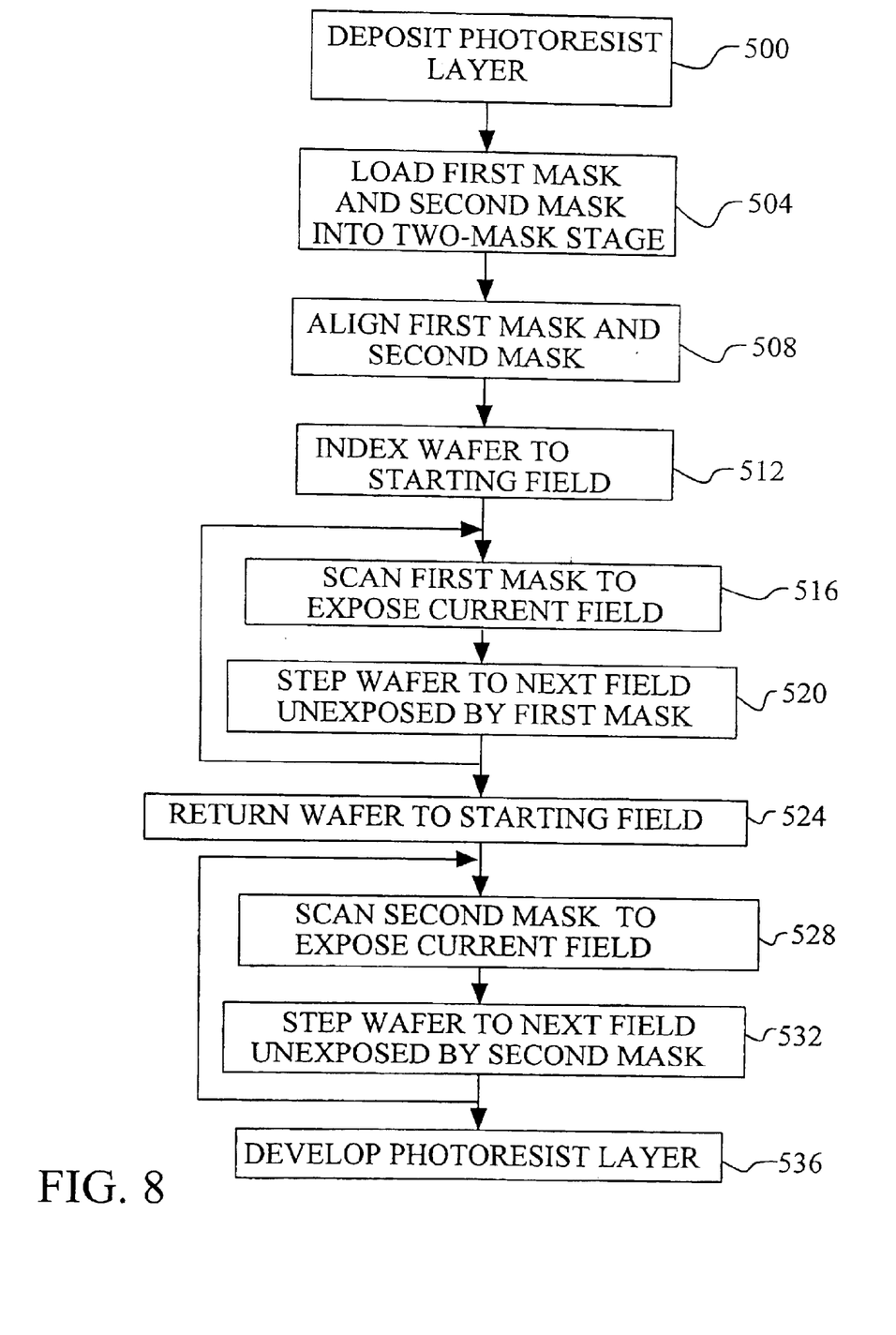
FIG. 8 illustrates, in flow chart form, a first preferred embodiment of the method of the present invention.

Referring now to FIG. 8, a first preferred embodiment of a method to pattern a photoresist layer in the manufacture of an integrated circuit device is shown. This method uses the novel two-mask stage of the apparatus of the present invention to improve the double-exposure scenario outlined in FIGS. 1 through 3. First, a photoresist layer is deposited overlying a semiconductor substrate in step 500. The first mask and the second mask are loaded into the novel two-mask stage in step 504. Note that, in this first embodiment of the double-exposure method, either the consistent (FIG. 5) or the perpendicular (FIG. 6) mask configuration may be used. The first mask and the second mask are aligned in step 508.

The first mask scan is now performed. First, the wafer is indexed to the starting field to set the current field location in step 512. Referring to FIG. 9, the starting field 406 is the uppermost, left-side field of the wafer. Referring again to FIG. 8, the first mask is scanned to expose the current field in step 516. The wafer is then stepped to the next field unexposed by the first mask to set a new current field in step 520. The scanning (step 516) and stepping (step 520) are repeated until all the fields on the wafer are exposed.

Referring once again to FIG. 9, a top view of the semiconductor wafer 400 is shown at the end of step 520. Every field 404 in the wafer has been exposed through the first mask at this point in the method.

Referring once again to FIG. 8, the second mask scan is now performed. The wafer is returned to the starting field 406 (in FIG. 9) to set the current field in step 524. The second mask is scanned to expose the current field in step 528. The wafer is then stepped to the next field unexposed by the second mask to set a new current field in step 532. The scanning (step 528) and stepping (step 532) are repeated until all the fields on the wafer are exposed.

Figure 10:
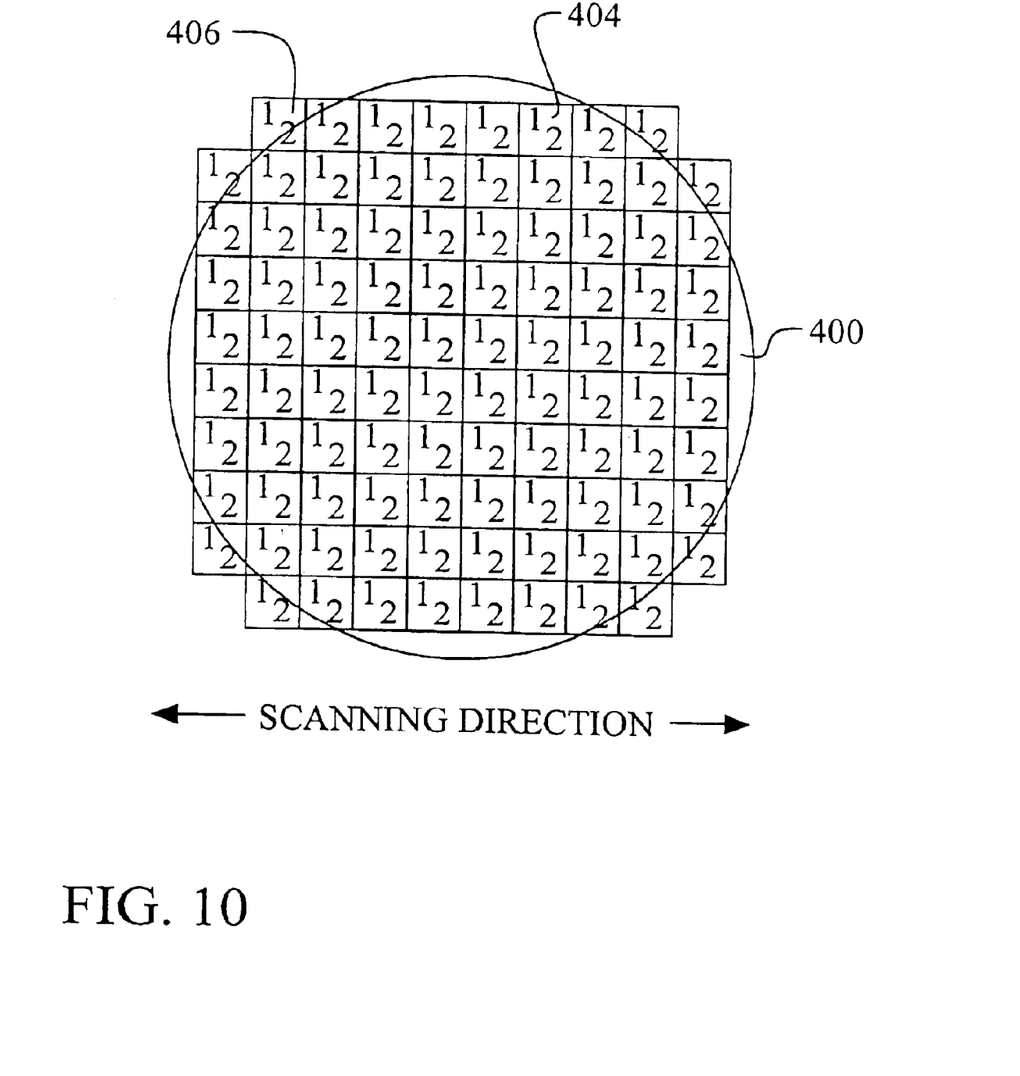

Referring now to FIG. 10, the semiconductor wafer 400 is shown at the end of step 532. Every field 404 has now been exposed through the second mask. Now, the pattern of the first mask and the second mask is superimposed on every field 404 of the wafer 400.

Referring once again to FIG. 8, the photoresist layer is developed to complete the method of patterning in step 536.

Figure 11:
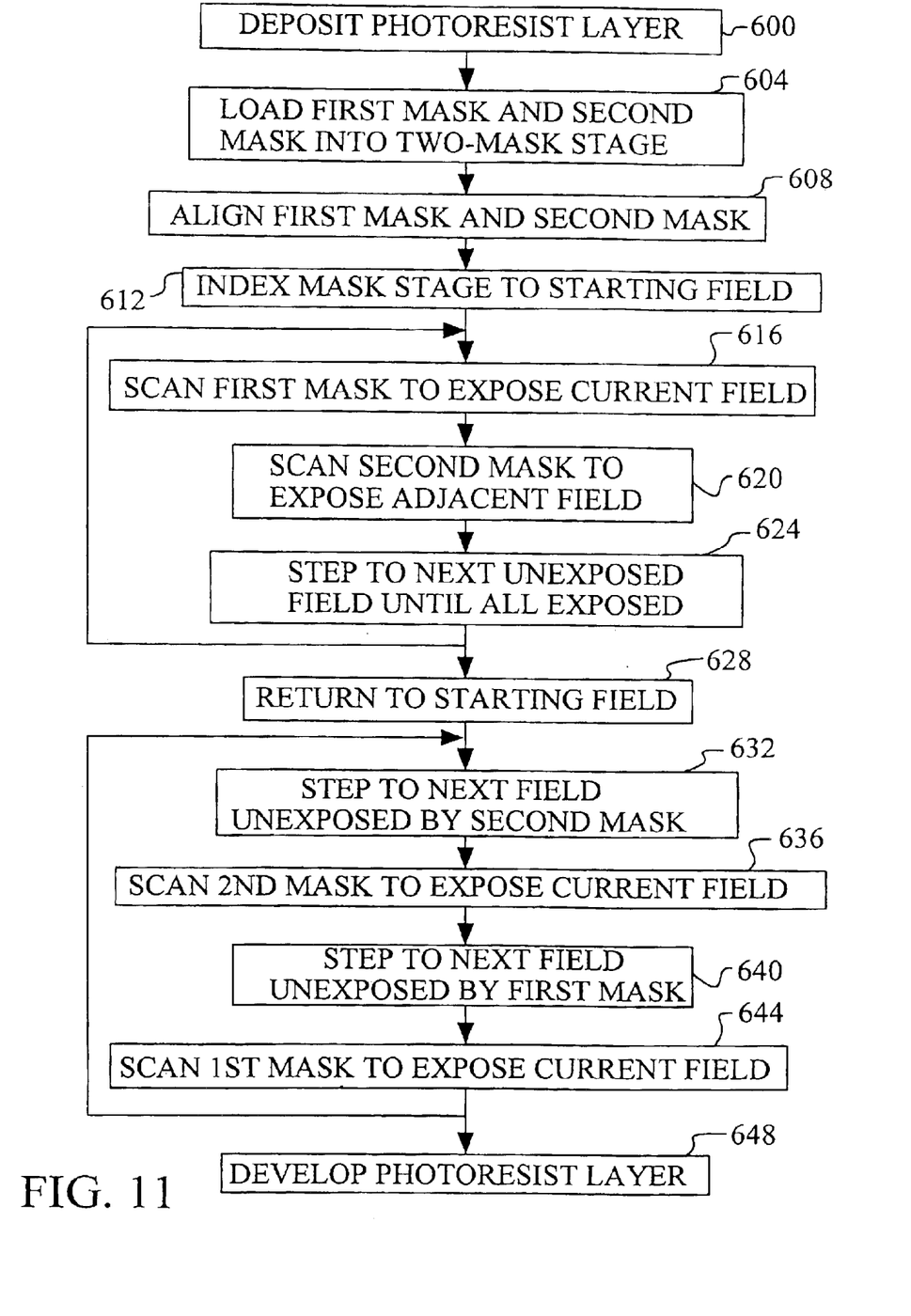
FIG. 11 illustrates, in flow chart form, a second preferred embodiment of the method of the present invention.

Referring now to FIG. 11, a second preferred embodiment of a method to pattern a photoresist layer in the manufacture of an integrated circuit device is shown. This method again uses the novel two-mask stage of the apparatus of the present invention to improve the double-exposure scenario outlined in FIGS. 1 through 3. First, a photoresist layer is deposited overlying a semiconductor substrate in step 600. The first mask and the second mask are loaded into the novel two-mask stage in step 604. Note that, in this second embodiment of the double-exposure method, only the consistent (FIG. 5) mask configuration may be used. The first mask and the second mask are aligned in step 608.

Figure 12:
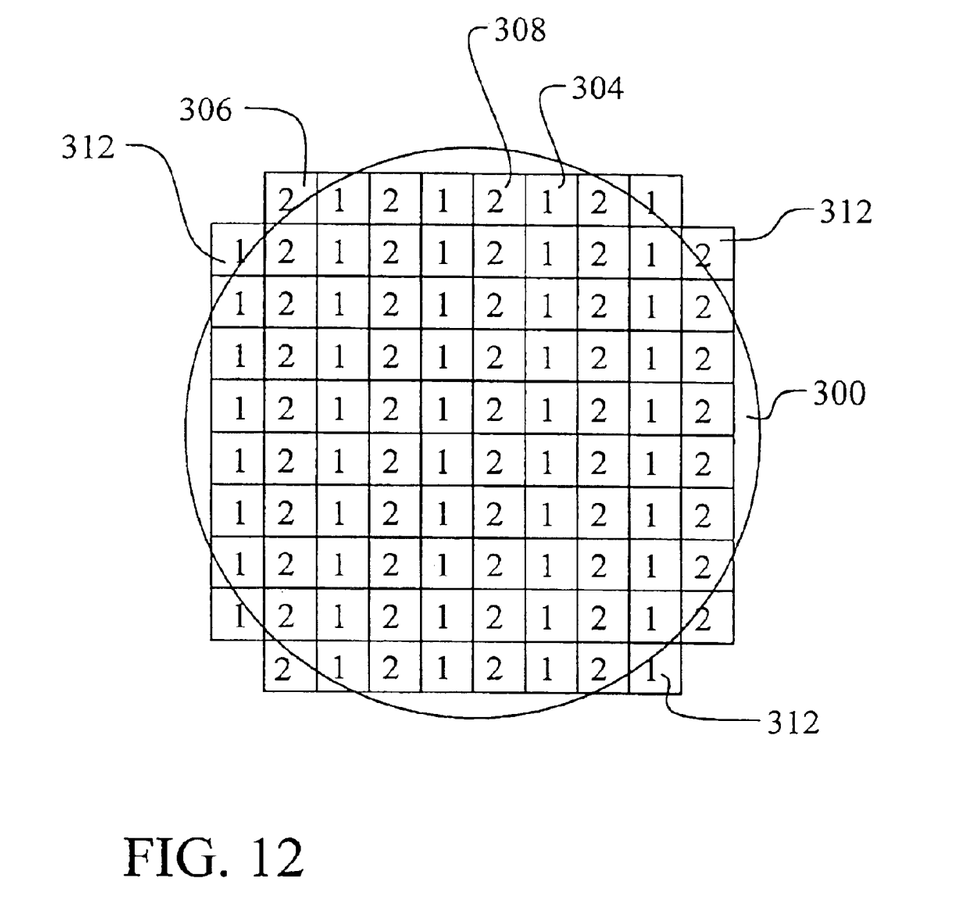
FIGS. 12 through 14 illustrate a semiconductor wafer processed by the second preferred embodiment of the method of the present invention.

The wafer is indexed to the starting field to set the current field in step 612. Referring to FIG. 12, the starting field 306 is the uppermost, left-side field of the wafer. Referring again to FIG. 11, the first mask is scanned to expose the current field in step 616. Next, the second mask is scanned to expose the adjacent field in step 620. Note that it is not necessary to step the mask stage to do this exposure since the second mask is held adjacent to the first mask and is already positioned to expose the field adjacent to the field exposed through the first mask. The wafer is now stepped to the next field unexposed by the first mask to set a new current field in step 624. The scanning (step 616 and step 620) and stepping (step 624) are repeated until all the fields on the wafer are exposed.

Referring once again to FIG. 12, a top view of the semiconductor wafer 300 is shown at the end of step 624. Every field on the wafer has been exposed through either the first mask 304 or the second mask 308 during this first pass scan.

Figure 13:
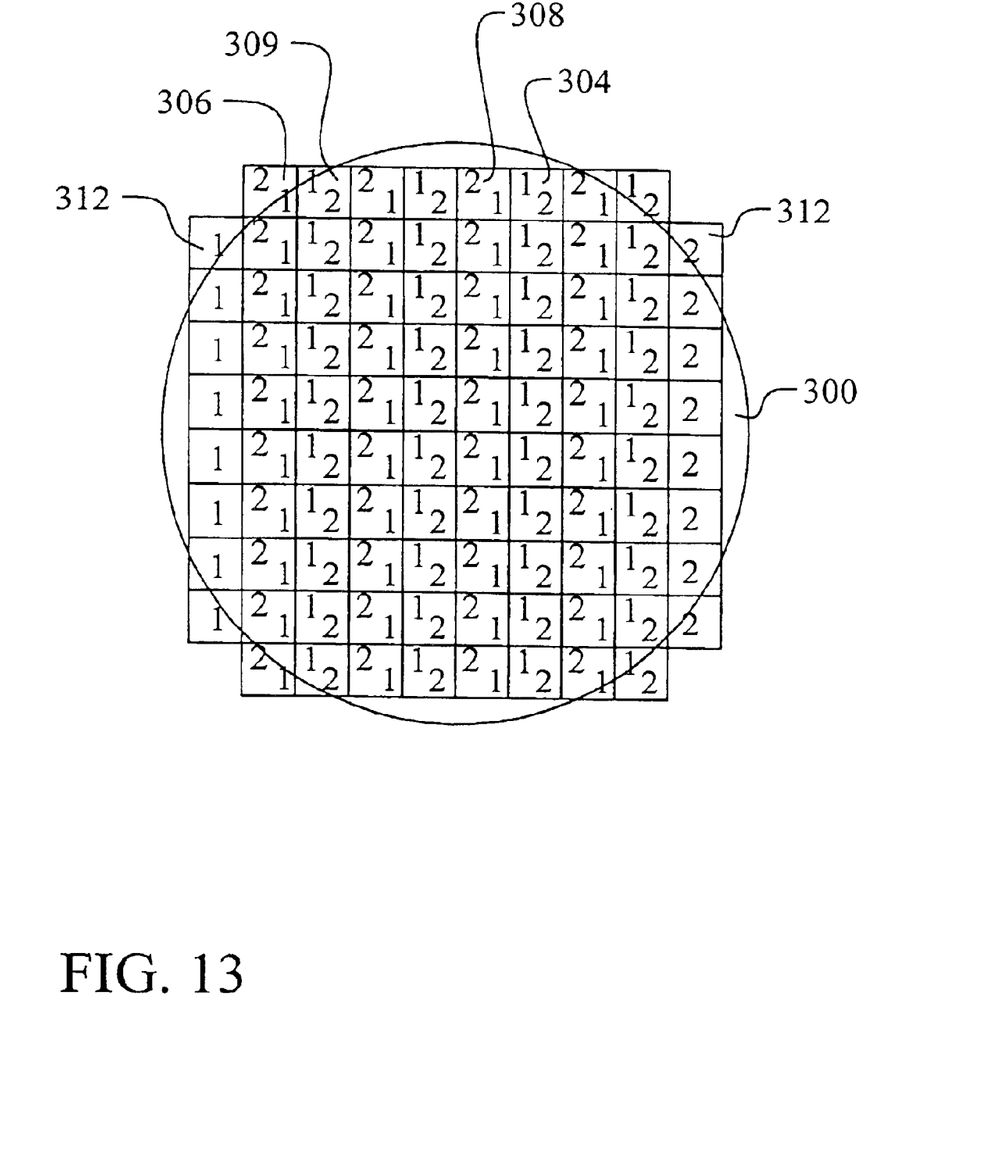

Referring once again to FIG. 11, the second pass scan is now performed. The wafer is returned to the starting field 306 (in FIG. 12) to set the current field in step 628. The wafer is stepped to the next field unexposed by the second mask to set a new current field. Referring now to FIG. 13, the next field unexposed by the second mask 309 is shown. The second mask is scanned to expose the current field in step 636. The wafer is then stepped to the next field unexposed by the first mask to set a new current field in step 640. The first mask is now scanned to exposed the current field in step 644. The scanning (step 636 and step 644) and stepping (step 640) are repeated until all the fields on the wafer are exposed.

Referring again to FIG. 13, the semiconductor wafer 300 is shown at the end of step 644. Now, the pattern of the first mask and the second mask is superimposed on every field 304 and 308 of the wafer 300. Note that only single mask scans are required at the beginning and ending fields 312 of each row. These single mask exposure fields are called fill-in fields 312.

Figure 14:
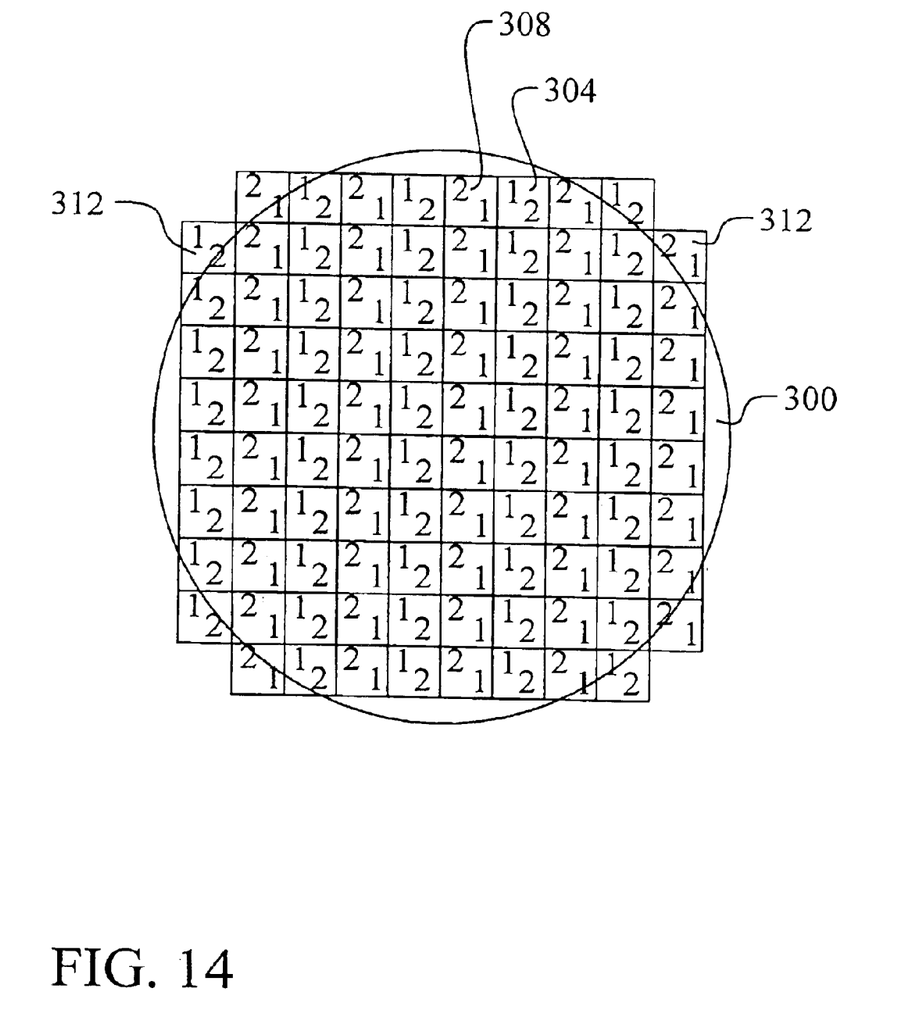

Referring now to FIG. 14, the fill-in fields may be completed using a partial scan wherein the stepper is programmed to single expose the beginning and ending fields 312 with the missing mask.

Referring once again to FIG. 11, the photoresist layer is developed to complete the method of patterning in step 648.

The optical lithographic exposure apparatus described provides a significant advantage over the prior art. The novel two-mask stage enables a double-exposure process without a time consuming mask change and alignment. This facilitates the use of alternating phase shifting mask (PSM) technology to produce very fine line width features in an integrated circuit manufacturing process. The methods of patterning a photoresist layer using the two-mask stage provide a very manufacturable approach to phase shifting mask lithography.

While the invention has been particularly shown and described with reference to the preferred embodiments thereof, it will be understood by those skilled in the art that various changes in form and details may be made without departing from the spirit and scope of the invention.

What is claimed is:

1. An optical lithographic exposure apparatus comprising:
    a wafer stage comprising a means of supporting a semiconductor wafer;
    a mask stage comprising a means of holding a first mask and a second mask and maintaining a fixed relative position between said first mask and said second mask, wherein the first mask comprises a first alignment mark and the second mask comprises a second alignment mark;
    a light source comprising a means of selectively shining actinic light through one of said first mask and said second mask;
    an imaging lens capable of focusing said actinic light onto said semiconductor wafer;
    a means of stepping said mask stage across said semiconductor wafer; and
    a microscope viewer comprising microscope objectives, wherein the microscope objectives comprises third alignment marks thereon for registering the first and second alignment marks.

2. The apparatus according to claim 1 wherein said apparatus consists of one of the group of: optical stepper and optical scanner.

3. The apparatus according to claim 1 wherein said fixed relative position between said first mask and said second mask comprises adjacent, coplanar, and consistent with direction of said stepping.

4. The apparatus according to claim 1 wherein said fixed relative position between said first mask and said second mask comprises adjacent, coplanar, and perpendicular to direction of said stepping.

5. The apparatus according to claim 1 wherein said mask stage further comprises a means of aligning said first mask and said second mask wherein said aligning may be performed for both said first mask and said second mask prior to any exposing and stepping.

6. The apparatus according to claim 5 wherein said means of aligning comprises a single lateral control (x) and an angular control (θ).

7. The apparatus according to claim 5 wherein said means of aligning comprises two lateral controls (x and y) and an angular control (θ).

8. The apparatus according to claim 5 wherein said means of aligning is independent for each of said first mask and said second mask.

9. The apparatus according to claim 1 wherein said mask stage further comprises a means of holding at least one additional mask and maintaining a fixed relative position between said first mask, said second mask, and said additional mask.

10. An optical lithographic exposure apparatus comprising:
   a wafer stage comprising a means of supporting a semiconductor wafer;
   a mask stage comprising a means of holding a first mask and a second mask and maintaining a fixed relative position between said first mask and said second mask and a means of aligning said first mask and said second mask prior to exposing and stepping, wherein the first mask comprises a first alignment mark and the second mask comprises a second alignment mark;
   a light source comprising a means of selectively shining actinic light through one of said first mask and said second mask;
   an imaging lens capable of focusing said actinic light onto said semiconductor wafer;
   a means of stepping said mask stage across said semiconductor wafer; and
   a microscope viewer comprising microscope objectives, wherein the microscope objectives comprises third alignment marks thereon for registering the first and second alignment marks.

11. The apparatus according to claim 10 wherein said apparatus consists of one of the group of: optical stepper and optical scanner.

12. The apparatus according to claim 10 wherein said fixed relative position between said first mask and said second mask comprises adjacent, coplanar, and consistent with direction of said stepping.

13. The apparatus according to claim 10 wherein said fixed relative position between said first mask and said second mask comprises adjacent, coplanar, and perpendicular to direction of said stepping.

14. The apparatus according to claim 10 wherein said means of aligning comprises a single lateral control (x) and an angular control (θ).

15. The apparatus according to claim 10 wherein said means of aligning comprises two lateral controls (x and y) and an angular control (θ).

16. The apparatus according to claim 10 wherein said means of aligning is independent for each of said first mask and said second mask.

17. The apparatus according to claim 10 wherein said mask stage further comprises a means of holding at least one additional mask and maintaining a fixed relative position between said first mask, said second mask, and said additional mask and a means of aligning said additional mask.

* * * * *